United States Patent
Barna et al.

(10) Patent No.: US 6,627,474 B2
(45) Date of Patent: Sep. 30, 2003

(54) INCREASING PIXEL CONVERSION GAIN IN CMOS IMAGE SENSORS

(75) Inventors: Sandor L. Barna, Pasadena, CA (US); Eric R. Fossum, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/137,041

(22) Filed: Apr. 30, 2002

(65) Prior Publication Data

US 2002/0151098 A1 Oct. 17, 2002

Related U.S. Application Data

(62) Division of application No. 09/553,980, filed on Apr. 20, 2000, now Pat. No. 6,445,022.
(60) Provisional application No. 60/130,998, filed on Apr. 23, 1999.

(51) Int. Cl.[7] .............................. H01L 21/00; G05F 1/40
(52) U.S. Cl. .............................. 438/48; 438/57; 323/284
(58) Field of Search ................................ 257/292, 291, 257/461, 370.08, 370.14, 370.15, 350, 431–432, 443–445; 327/513–514; 438/48, 22–24, 57, 129; 348/300, 308; 250/208.1; 323/284

(56) References Cited

U.S. PATENT DOCUMENTS

| | | | | |
|---|---|---|---|---|
| 5,949,225 A | * | 9/1999 | Sawtell | 323/284 |
| 6,043,525 A | * | 3/2000 | Chen | 257/292 |
| 6,344,670 B2 | * | 2/2002 | Yamaguchi et al. | 257/292 |

* cited by examiner

*Primary Examiner*—Wael Fahmy
*Assistant Examiner*—(Vikki) Hoa B. Trinh
(74) *Attorney, Agent, or Firm*—Dickstein Shapiro Morin & Oshinksky LLP

(57) ABSTRACT

A pixel sensor system includes a photo-sensor, an output amplifier, and a feedback capacitor. The photo-sensor is configured to receive photons and to convert the photons into charge. The output amplifier has at least two transistors in a cascoded configuration. The amplifier converts the charge into electronic signal. The feedback capacitor is disposed between the photo-sensor and an input of the output amplifier.

5 Claims, 5 Drawing Sheets

INCREASING PIXEL CONVERSION GAIN IN CMOS IMAGE SENSORS

CROSS-REFERENCE TO RELATED APPLICATION

This application is a divisional of U.S. application Ser. No. 09/553,980, filed Apr. 20, 2000, now U.S. Pat. No. 6,445,022, which claims benefit of U.S. provisional application Ser. No. 60/130,998, filed Apr. 23, 1999.

BACKGROUND

The present disclosure relates to a technique of increasing pixel conversion gain in a CMOS image sensor, specifically an active pixel sensor.

Electronic image sensors obtain an electrical image of a subject. The sensor converts the incoming light photons to an electronic signal. The sensitivity of conversion between the photons and electrons is often measured with a quantity called conversion gain.

Many image sensor devices convert the incoming photons to charge using a photo-gate. That charge is stored in a substrate. Other devices convert the incoming photons to electrons using a photodiode. In the devices using photodiodes, it was found to be advantageous to enlarge the size of the photodiode. The large size allows more light to be received by the photodiode.

The conversion gain of a photodiode pixel, expressed in volts per photon, is often inversely proportional to pixel size. Thus, although the number of incident photons on a pixel increases with pixel area, the corresponding reduction in conversion gain prevents a matching increase in pixel sensitivity. This is often addressed by using photo-gate pixels or other structures that isolate the sensor node of the pixel from the collection area. However, these solutions often involve an increase in the number of transistors within the pixel. The increase in the transistor count reduces fill factor. Further, the source follower output stage introduces a non-linearity in pixel response.

SUMMARY

In one embodiment of the present invention, a pixel sensor system is disclosed. The system includes a photo-sensor, an output amplifier, and a feedback capacitor. The photo-sensor is configured to receive photons and to convert the photons into charge. The output amplifier has at least two transistors in a cascoded configuration. The amplifier converts the charge into electronic signal. The feedback capacitor is disposed between the photo-sensor and an input of the output amplifier.

In another embodiment of the present invention, a method for increasing a pixel conversion gain is disclosed. The method includes providing a feedback capacitor between a photo-sensor and a pixel circuit, and adjusting the feedback capacitor to increase pixel sensitivity.

In a further embodiment, an image sensor is disclosed. The sensor includes an array of pixel sensors. Each sensor includes a photo-sensor, an output amplifier, and a feedback capacitor. The photo-sensor is configured to receive photons and to convert them into charge. The output amplifier includes at least two transistors in a cascoded configuration. The amplifier converts the charge into electronic signal. The feedback capacitor is disposed between the photo-sensor and an input of the output amplifier. The image sensor further includes a controller configured to provides timing and control signals to enable read out of signals stored in each pixel sensor.

BRIEF DESCRIPTION OF THE DRAWINGS

Different aspects of the disclosure will be described in reference to the accompanying drawings wherein.

DETAILED DESCRIPTION

Figure 1:
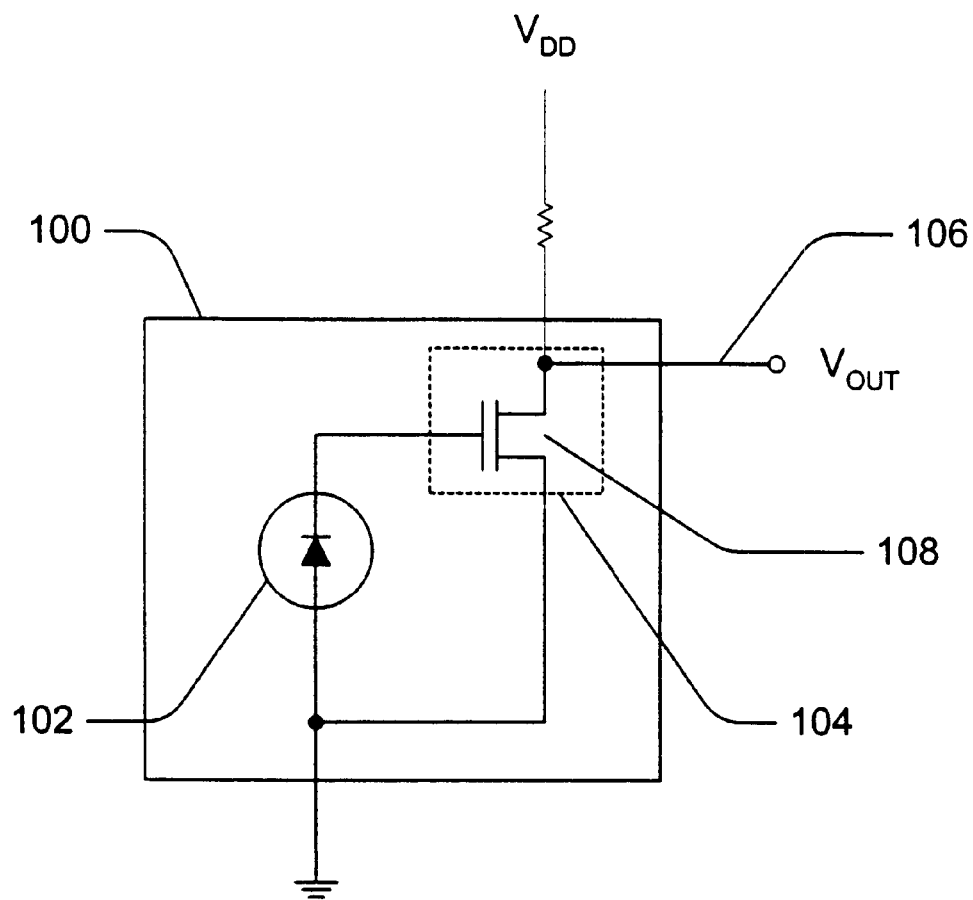
FIG. 1 shows a schematic representation of a conventional photodiode pixel.

A schematic representation of a conventional photodiode pixel is shown in FIG. 1. Each pixel 100 includes a photodiode area 102 and associated circuitry area 104. The device shown in FIG. 1 is an "active pixel" which means that each pixel includes at least some circuitry associated with the pixel and actually formed within the pixel. Circuitry 104 is shown schematically as including a source follower transistor 108, but it should be understood that other associated circuitry may also be integrated into the pixel. That associated circuitry is preferably formed of NMOS or CMOS.

The source follower transistor 108 in an active pixel sensor converts the accumulated charge from the photodiode 102 into a voltage. The voltage V at node 106 is proportional to charge Q received by the photodiode 102 divided by the photodiode capacitance C. However, it was found that increasing the diode size decreases the conversion gain (V/photon count), since it correspondingly increases the photodiode capacitance more than the associated increase in charge. Thus, an increase in diode size effectively reduces the light sensitivity of a pixel.

In recognition of the above-described problems with the prior design, the inventors have developed a system for increasing the pixel conversion gain. In some embodiments, the system allows adjustment of the conversion gain independent of the photodiode size, and hence, its capacitance.

Figure 2:
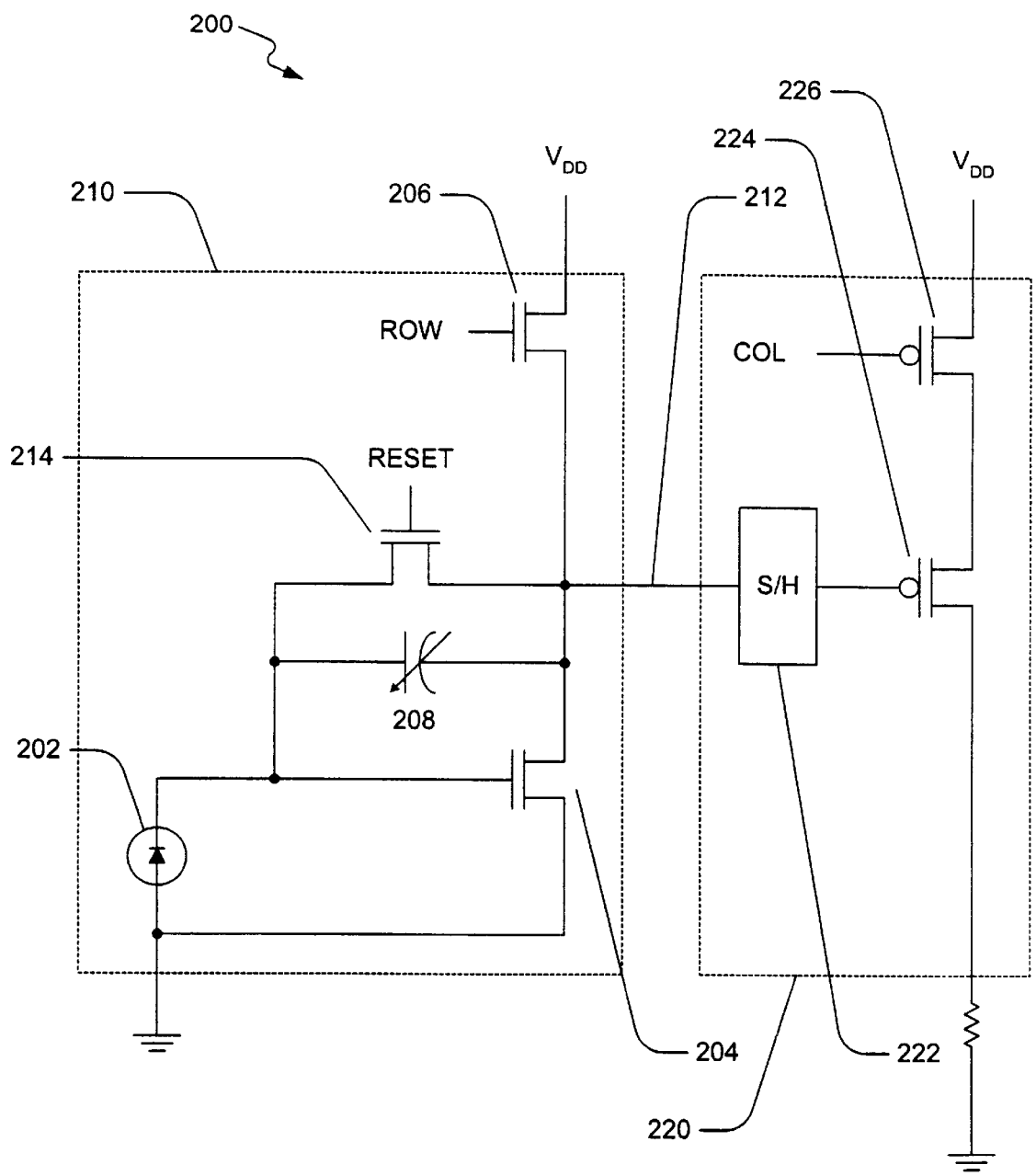
FIG. 2 is a schematic diagram of an image sensor system according to an embodiment of the present invention.

A schematic diagram of a system 200 according to an embodiment of the present invention is shown in FIG. 2. In the illustrated embodiment, a CMOS active pixel sensor 210 may include a photodiode 202 buffered by a cascoded inverting amplifier having two MOSFET transistors 204, 206. In this embodiment, the transistors 204, 206 are n-channel MOSFET transistors.

A signal 'ROW' is applied to the gate of the row selection transistor 206 to enable a particular row of pixels. When the row is not selected, the cascoded amplifier is turned off. In this state, the photodiode 202 accumulates charge. When the row is selected, current flows through the cascoded amplifier. In this state, the accumulated charge is transferred to a feedback capacitor ($C_f$) 208.

In the illustrated embodiment, the output voltage $V_{out}$ at node 212 is the product of the accumulated charge Q and the feedback capacitance, $C_f$:

$$V_{OUT} = \frac{Q}{C_d/C_f} = \frac{Q * C_f}{C_d}. \tag{1}$$

Therefore, the conversion gain of the pixel amplifier is the ratio of the photodiode capacitance ($C_d$) to the feedback capacitance ($C_f$):

$$G = \frac{V_{OUT}}{\text{no. of photons}} = \frac{Q*(C_f/C_d)}{\text{no. of photons}}. \quad (2)$$

The equations (1) and (2) highlight the advantages of having a feedback capacitor 208 in the active pixel sensor 210. The feedback capacitor 208 enables increase in pixel conversion gain by adjusting the ratio of the photodiode capacitance to the feedback capacitance.

Closing the reset switch 214 while the row is selected resets the pixel. This removes the charge on the feedback capacitor 208, and restores the photodiode voltage to the quiescent operating voltage of the amplifier. This voltage is dependent on the specific properties of the transistors 204, 206, 214. Thus, the reset level will also need to be sampled to remove fixed pattern noise. A sample-and-hold circuit 222 in the column readout circuit 220 samples both the signal and the reset values.

In the illustrated embodiment of FIG. 2, a p-type cascoded amplifier having two p-channel MOSFET transistors 224, 226 is shown. The cascaded amplifier in the output stage of the column readout circuit 220 substantially reduces non-linearity in pixel response.

The gain transistor 224 may be operated in common-emitter or common-collector mode that utilizes a second transistor 226 in a common-base mode. The emitter of the second transistor 226 is connected to the collector of the gain transistor 224. Having substantially unity current gain, wide bandwidth, and low distortion, the second transistor 226 shields the gain transistor 224 from voltage changes in the circuit.

Figure 3:
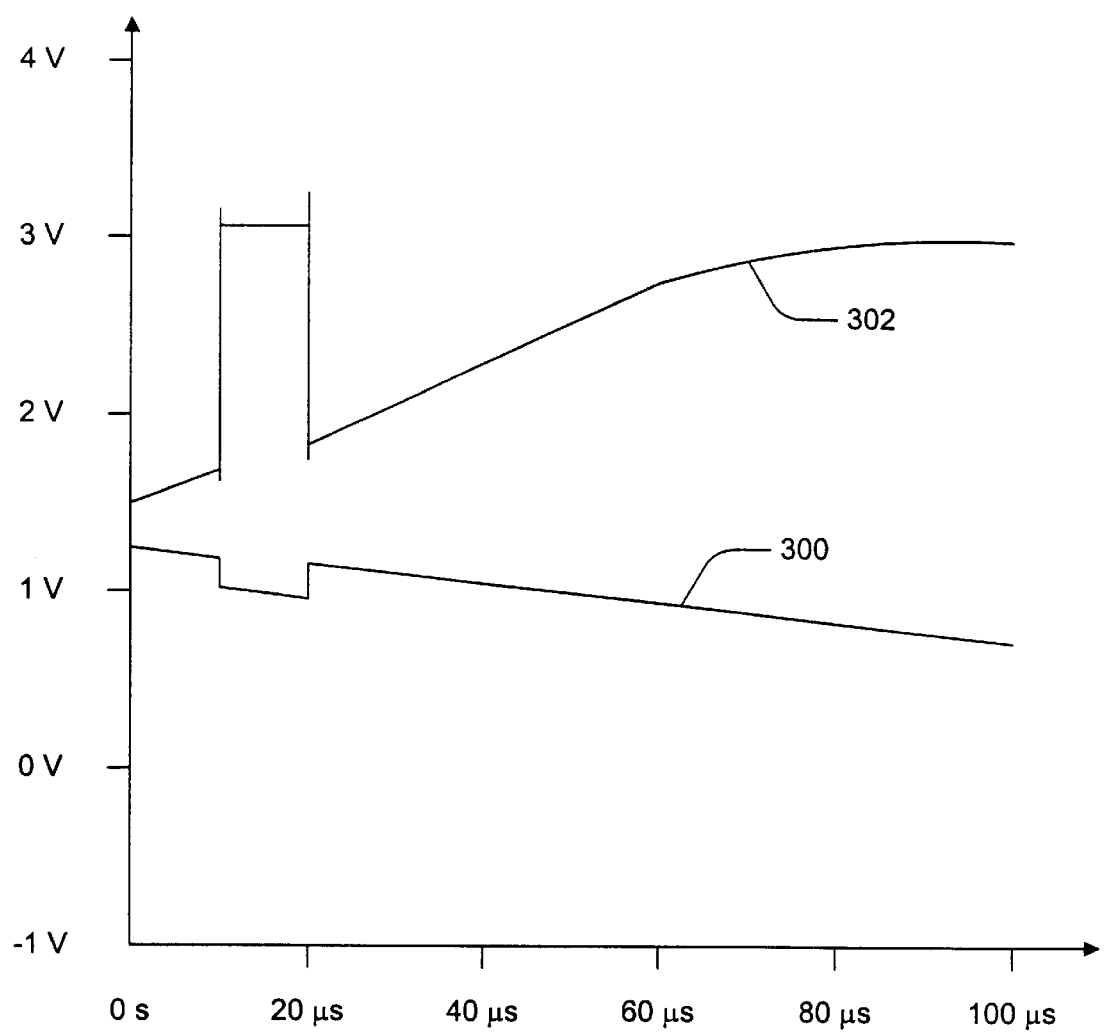
FIG. 3 shows plots of photodiode and output voltage measured with a simulation of the circuit shown in FIG. 2.

FIG. 3 shows plots of photodiode and output voltage measured with a simulation of the circuit shown in FIG. 2. The curve 300 is the photodiode voltage measured from the integration of the photocurrent. The curve 302 is the output voltage of the amplifier. In the illustrated embodiment, the row is unselected at 10 $\mu$s and re-selected at 20 $\mu$s. A steady source of current is applied at the photodiode. As the simulation shows, the disconnection of the current source does not significantly affect the integration of the charge on the photodiode. Therefore, it is shown that the cascaded amplifier in the output stage promotes substantial linearity in pixel response.

Figure 4:
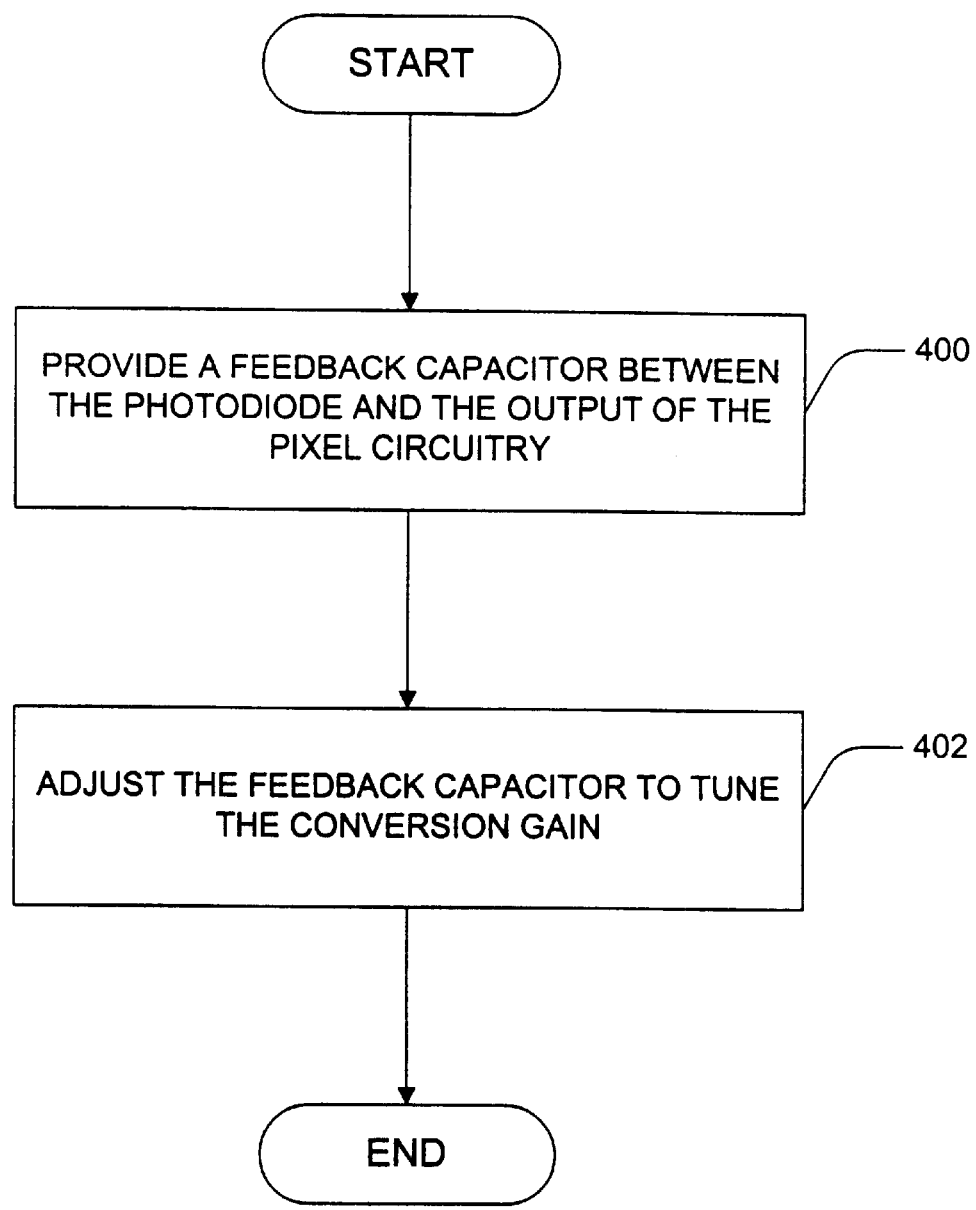
FIG. 4 is a flowchart for increasing a pixel conversion gain in accordance with an embodiment of the present invention.

FIG. 4 illustrates a technique for increasing a pixel conversion gain in accordance with an embodiment of the present invention. In the illustrated flowchart, the technique involves providing a feedback capacitor between a photodiode and an output of the pixel circuitry at 400. At 402, the feedback capacitor may be adjusted to tune the conversion gain. In some embodiments, the conversion gain is tuned to increase the pixel sensitivity.

Figure 5:
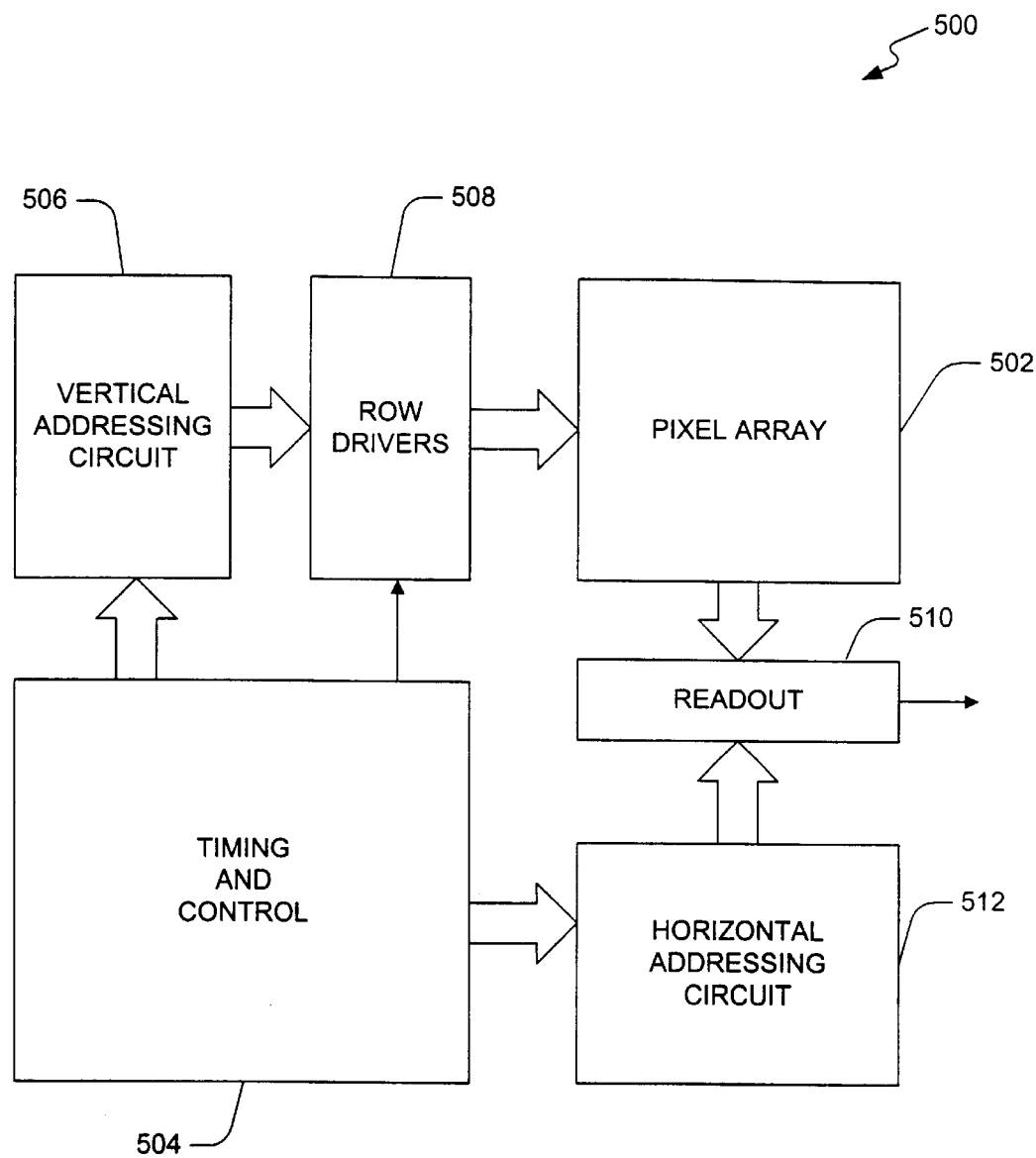
FIG. 5 an exemplary block diagram of a CMOS image sensor integrated circuit chip.

FIG. 5 shows an example of a CMOS image sensor integrated circuit chip 500. The chip 500 includes an array of active pixel sensors 502 and a controller 504. The controller 504 provides timing and control signals to enable read out of signals stored in the pixels. For some embodiments, arrays can have dimensions of 128×128 or larger number of pixels. However, in general, the size of the array 502 will depend on the particular implementation. The image array 502 is read out a row at a time using column-parallel readout architecture. The controller 504 selects a particular row of pixels in the array 502 by controlling the operation of vertical addressing circuit 506 and row drivers 508. Charge signals stored in the selected row of pixels are provided to a readout circuit 510. Each pixel in the array 502 includes a feedback capacitor to enable adjustment of conversion gain. The pixels read from each of the columns can be read out sequentially using a horizontal addressing circuit 512.

While specific embodiments of the invention have been illustrated and described, it will be obvious to those skilled in the art that various changes and modifications may be made without sacrificing the advantages provided by the principles disclosed herein. For example, even though the present system has been described in terms of a photodiode pixel sensor, the system may be practiced with other photo-sensors. Accordingly, the invention may be embodied in other specific forms without departing from its spirit or essential characteristics.

All these are intended to be encompassed by the following claims.

What is claimed is:

1. A method for increasing a pixel conversion gain in an image sensor, comprising:

providing a feedback capacitor between a photo-sensor configured to receive photons and to convert said photons into charge and an input of an amplifier of a pixel circuit operating to convert said charge into an electronic signal; and adjusting the feedback capacitor to increase a magnitude of said electronic signal.

2. The method of claim 1, further comprising:

in a first phase, permitting charge to accumulate in said photo-sensor; and in a second phase, transferring accumulated charge from said photo-sensor to said feedback capacitor.

3. The method of claim 1, further comprising:

removing accumulated charge from said feedback capacitor.

4. The method of claim 1, wherein said electronic signal is a voltage.

5. The method of claim 1, wherein said photo-sensor is a photodiode.

* * * * *